United States Patent [19]

Menzel

[11] 4,172,718
[45] Oct. 30, 1979

[54] TA-CONTAINING AMORPHOUS ALLOY LAYERS AND PROCESS FOR PRODUCING THE SAME

[75] Inventor: Güenther Menzel, Munich, Fed. Rep. of Germany

[73] Assignee: Siemens Aktiengesellschaft, Berlin & Munich, Fed. Rep. of Germany

[21] Appl. No.: 901,800

[22] Filed: May 1, 1978

[30] Foreign Application Priority Data

May 4, 1977 [DE] Fed. Rep. of Germany ....... 2719988

[51] Int. Cl.² ...................... C22C 27/02; H01C 1/012
[52] U.S. Cl. ...................................... 75/174; 338/308
[58] Field of Search .................. 75/174, 176, 170; 427/124; 338/308

[56] References Cited

U.S. PATENT DOCUMENTS

| | | | |
|---|---|---|---|
| 3,427,154 | 2/1969 | Mader et al. | 75/134 |
| 3,537,891 | 11/1970 | Rairden | 338/308 |
| 3,546,015 | 12/1970 | Vulliez et al. | 338/308 |
| 3,607,384 | 9/1971 | Banks et al. | 338/308 |
| 3,856,513 | 12/1974 | Chen et al. | 75/176 |
| 3,955,039 | 5/1976 | Roschy et al. | 75/174 |
| 4,059,441 | 11/1977 | Ray et al. | 75/174 |
| 4,063,211 | 12/1977 | Yasujima et al. | 75/174 |

FOREIGN PATENT DOCUMENTS

1476589  6/1977  United Kingdom .

OTHER PUBLICATIONS

Chen et al., "Evidence of Glass-Liquid Transition in a Gold-Germanium-Silicon Alloy," Journal of Chemical Physics, vol. 48, No. 6, Mar. 1968, pp. 2560-2571.
Hasegawa et al., "S-D Exchange in Amorphous Cr-P-d-Si and Mn-Pd-Si Alloys," Physical Review B, vol. 2, No. 6, Sep. 1970, pp. 1631-1643.
Sinha, "Electrical Resistivity, Thermoelectric Power, and X-Ray Interference Function of Amorphous Ni-P-t-P Alloys," Physical Review B, vol. 1, No. 12, Jun. 1970, pp. 4541-4546.
Gilman, "Metallic Glasses," Physics Today, vol. 28, No. 5, May 1975.
Duwez et al., "Rapid Quenching of Liquid Alloys," Transactions of the Metallurgical Society of AIME, vol. 227, pp. 362-365.
Ruhl et al., "New Microcrystalline Phases in Nb-Ni and Ta-Ni Systems," Acta Metallurgica, vol. 15, Nov. 1967, pp. 1693-1702.
"Glassy Metals: No Longer a Laboratory Curiosity," Science, vol. 122, Nov. 1973, pp. 908-910.

*Primary Examiner*—L. Dewayne Rutledge
*Assistant Examiner*—Peter K. Skiff
*Attorney, Agent, or Firm*—Hill, Van Santen, Steadman, Chiara & Simpson

[57] ABSTRACT

An amorphous alloy layer comprised of Ta and another element selected from the group consisting of Ni, Co and N is formed by vapor deposition of the select elements onto a low temperature (below about $-90°$ C.) substrate, such as glass. The resultant amorphous alloy layers are useful in thin film technology and are generally stable at room temperatures and up to about 300° C. while exhibiting a specific electrical resistance generally ranging from about 130 to 900 $\mu\Omega \cdot$ cm and exhibit a relatively low temperature coefficient for such resistance, generally ranging from about $-950$ to $+500$ ppm/° K.

2 Claims, 1 Drawing Figure

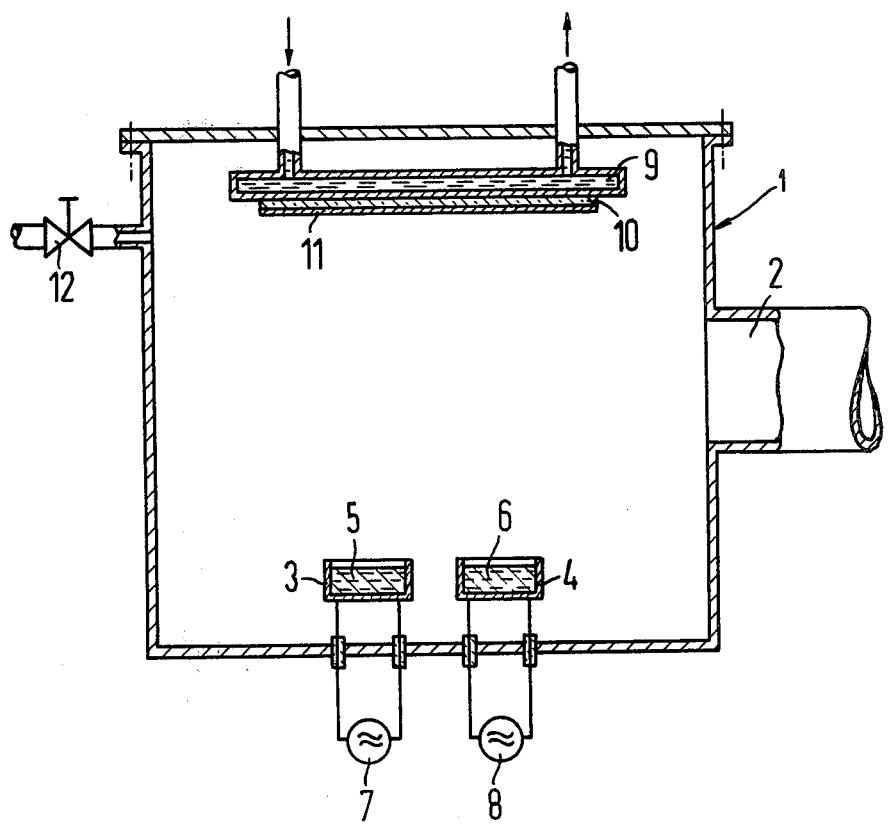

TA-CONTAINING AMORPHOUS ALLOY LAYERS AND PROCESS FOR PRODUCING THE SAME

BACKGROUND OF THE INVENTION

1. Field of the Invention

The invention relates to amorphous alloy layers and somewhat more particularly to amorphous alloy layers containing Ta and to a method of producing such layers.

2. Prior Art

Metal and metal-containing alloys in an amorphous state exhibit properties which are of technical interest, such as, for example, a relatively high degree of magnetic permeability, a relatively high specific electrical resistance and a relatively low or even negative value of temperature coefficient for the electrical resistance (for example, see "Journal of Chem. Physics" Vol. 48, No. 6 (1968), pages 2560–2571; "Physical Rev. B" Vol. 1, No. 12 (1970), pages 4541–4546; "Physical Rev. B" Vol. 2, No. 6 (1970), pages 1631–1743; and/or "Physics Today," Vol. 28, No. 5 (1975), John J. Gilman). Numerous methods have been developed for the production of such amorphous metals and alloys which, on the one hand, are based on stabilization of the unordered state of liquid metals or alloys via quenching, and on the other hand, on condensation of metal or other element vapors onto cooled substrates.

The so-called "Splat-Cooling" technique employs the principles of quenching and this technique has been described, for example, in "Trans. Met. Soc. of AIME," Vol. 227 (1963), pages 362–365; "ACTA Met.," Vol. 15 (1967), pages 1693–1702; or U.K. Patent Specification No. 1,476,589. The thickness of amorphous metal layers attainable with this liquid quenching technique ranges from about 10 to 100 $\mu$m.

In contrast, with the "vapor quenching" technique, the materials or elements which are to form an amorphous layer are atomized onto a low temperature substrate or are condensed onto such substrate from a vapor phase. The vapor quenching technique permits extremely low layer thicknesses to be achieved, say less than 1 $\mu$m, and provides a very high degree of accuracy in the thickness of the deposited layer. The quenching rate is in the order of about $10^{6°}$ to $10^{8°}$ K./sec. Further, this technique may be used to produce multi-component alloy layers by simultaneous deposition of a plurality of select components or elements on a cooled substrate (for example, see U.S. Pat. No. 3,427,154).

The thin amorphous alloy layers, however produced, may, if they are stable at higher temperatures, be employed in thin film technology, i.e., as in thin film resistors. However, amorphous alloy layers of this type which are formed on low temperature substrates are generally transformed into a crystalline state at higher temperatures, some even at room temperatures. In order to maintain the amorphous state of such layers over greater temperature ranges, certain "stabilizers" such as for example, Bi, B, Ge, P, Si or S are incorporated into such layers during the production thereof. However, such stabilizers or additives tend to undesirably alter the technologically useful properties of amorphous alloy layers.

In heretofore known methods of producing amorphous alloy layers via high vacuum techniques, impurities present in the residual gas were incorporated in an unordered manner within the so-formed layers. Impurities incorporated in this manner tend to stabilize the amorphous state, although they change, for example, the electrical properties of such layers and strongly reduce the reproducibility of layers having precisely determined properties.

SUMMARY OF THE INVENTION

The invention provides Ta-containing amorphous alloy layers and a method of producing such layers whereby improved stability of the amorphous state is achieved at higher temperatures, such as, for example, room temperature and whereby such layers can be produced with a high degree of reproducibility in regard the thickness (i.e., relatively thin) and uniformity thereof and with respect to the properties thereof, such as, for example, the specific electrical resistance and the temperature coefficient of electrical resistance.

In accordance with the principles of the invention, relatively thin amorphous alloy layer comprised of Ta and another element selected from the group consisting of Co, Ni and N are produced by vaporizing, atomizing or otherwise generating Ta and such other element vapors or particles in a suitably operational vacuum environment, such as an ultra-high vacuum environment and depositing the so-produced vapors or particles onto a low temperature substrate. In one embodiment of the invention, the other element is Ni and the formed amorphous alloy layer contains about 20 to 55 atomic percent of Ni therein. In another embodiment of the invention, the other element is Co and the formed amorphous alloy layer contains about 20 to 80 atomic percent of Co therein. In yet another embodiment of the invention, the other element is N and the formed amorphous alloy layer contains an amount of N therein which is about equal to the amount of N which would be incorporated in a Ta layer during vaporization or atomization of Ta and deposition thereof on a cooled substrate in an $N_2$ atmosphere having a partial pressure of $N_2$ ranging from about $3 \cdot 10^{-8}$ Pa to about $6 \cdot 10^{-4}$ Pa.

BRIEF DESCRIPTION OF THE DRAWINGS

The FIGURE is a somewhat schematic elevational view of an exemplary apparatus useful in the practice of the invention.

DESCRIPTION OF THE PREFERRED EMBODIMENTS

The invention provides amorphous alloy layers comprised of Ta and another element selected from the group consisting of Ni, Co and N, as well as a method of producing such layers.

Ta-containing amorphous alloy layers produced in accordance with the principles of the invention are stable at higher temperatures, such as, for example, room temperature and up to about 300° C. and exhibit highly reproducible properties, such as, for example, specific electrical resistance and temperature coefficient of electrical resistance.

In one embodiment of the invention, the amorphous alloy layer comprises Ta and about 20 to 55 atomic percent of Ni. Such amorphous Ta-Ni layers remain stable at temperatures up to about 300° C. and exhibit a specific electrical resistance which ranges between about 130 to about 320 $\mu\Omega \cdot$ cm (microohm · centimeter) and exhibit a temperature coefficient for such resistance which varies between about +500 to −300 ppm/° K.

In another embodiment of the invention, the amorphous alloy layer comprises Ta and about 20 to 80 atomic percent of Co. Such amorphous Ta-Co layers remain stable up to about 350° C. and exhibit a specific electrical resistance which ranges between about 150 to about 250 $\mu\Omega \cdot$ cm and exhibit a temperature coefficient for such resistance which varies between about $-200$ to $+200$ ppm/° K.

In a further embodiment of the invention, the amorphous alloy layer comprises a Ta layer formed by generating Ta particles in an operable vacuum environment having $N_2$ therein at a partial pressure of at least about $6 \cdot 10^{-4}$ Pa. and depositing such Ta particles onto a substrate cooled at least below about $-90°$ C. so that an amount of nitrogen is incorporated within the so-formed Ta layer. Such amorphous Ta-N layers remain stable up to about 300° C. and exhibit a specific electrical resistance which, for example, is about 900 $\mu\Omega \cdot$ cm for a $N_2$ partial pressure of $6 \cdot 10^{-4}$ Pa. and exhibit a temperature coefficient for such resistance which varies between about $-750$ and $-950$ ppm/° K.

In accordance with the principles of the invention, when Ni or Co are utilized as an additive, the so-formed amorphous alloy layer consists only of metallic elements but nevertheless remains amorphous at temperatures up to about 350° C. In instances where the amorphous alloy layers are produced in an ultra-high vacuum environment, no undefined impurities can be incorporated within such a layer and this further increases the reproducibility of such layers and their properties. When nitrogen is utilized as an additive, it behaves in an inert manner. Further, the use of nitrogen is also advantageous in that during the production of layers of this type, only one vapor or particle source is required, i.e., for the tantalum, as nitrogen can be supplied to the operational vacuum environment as a gas, for example, through an appropriate valve means. The properties of such a layer can be positively controlled by varying the nitrogen partial pressure within an operable vacuum environment.

The substrate, which may be glass, a quartz crystal, $Al_2O_3$ or BeO, may be cooled by liquid $H_2$ or $N_2$ to a select temperature, which during deposition is at least below about $-90°$ C.

The drawing illustrates an exemplary apparatus useful for the production of amorphous alloy layers containing Ta therein in accordance with the principles of the invention.

In the exemplary embodiment to be described, the production of an amorphous layer comprised of Ta and Ni is discussed in detail and it will be appreciated that similar amorphous Ta layers containing Co or N may also be produced in a similar fashion.

A suitable housing 1 for providing an operational vacuum (deposition) environment is connected via a conduit 2 to an ultra-high vacuum pump means (not shown) so that a suitable vacuum environment can be provided within the interior of the housing for deposition of the desired amorphous layer. Two vaporization crucibles 3 and 4 are positioned within the housing 1 for generating vapors or particles of the components forming a desired amorphous alloy layer. In the instant embodiment, crucible 3, for example, may be provided with an amount of tantalum 5 and crucible 4 may be provided with an amount of nickel 6. The crucibles 3 and 4 are, respectively, operationally coupled to controllable current sources 7 and 8 so that the materials within each crucible can be heated to a select temperature. Of course, other particle generating means may also be utilized, such as an electron beam vaporizing means. A cooling means 9 is also positioned within housing 1, generally opposite the crucibles 3 and 4, and is coupled to a hydraulic heat-exchange circuit containing a coolant, such as liquid $H_2$ or $N_2$, so that the cooling means 9 can be maintained at a select low temperature. A substrate 10, for example, composed of glass, is mounted in good contact with the cooling means 9 so that the substrate temperature is substantially identical with that of the cooling means. An amorphous alloy layer 11 is, upon energization of the apparatus, deposited on the free surface of the substrate 10.

In operation, elemental tantalum and nickel, each having a purity of about 99.999%, are used as the starting materials. Such starting materials are introduced into their respective crucibles 3 and 4 and the apparatus is activated to melt the materials within the crucibles and establish an ultra-high vacuum environment within the housing 1. The materials are then melted and annealed to produce a uniform melt of each element in the ultra-high vacuum so that when the entire apparatus has been heated to about 200° C., the final pressure in the system (i.e., within housing 1) has attained at least about $3 \cdot 10^{-8}$ Pa. (1 Pa. = $1 \cdot 10^{-10}$ Torr). Thereupon, crucibles 3 and 4 are further heated so that tantalum and nickel particles or vapors are generated from the melt within the crucibles. During this particle or vapor generation, the pressure within the operational environment (i.e., the interior of housing 1) may rise to about $9 \cdot 10^{-8}$ to $8 \cdot 10^{-7}$ Pa. Under these parameters the deposition rate of the so-generated particles on the substrate surface amounts to about 0.2 nm/sec. and the deposition is continued until a layer thickness of, for example, 45 to 80 nm has been attained.

The investigations carried out in association with this exemplary embodiment have shown that when layers are produced so as to have Ta and between about 8 to 20 atomic percent of Ni, a phase mixture of α-tantalum and amorphous nickel-tantalum alloy is formed. Further, when such layers are produced so as to have Ta and more than about 55 atomic percent of Ni therein, a phase mixture of β-tantalum and amorphous nickel-tantalum alloy is formed. While layers containing Ta and such phase mixtures may be useful, it is preferable to form layers having Ta and substantially only amorphous nickel-tantalum alloys therein and accordingly, the nickel content in the deposited layer is so-controlled (for example, by controlling the amount of energy supplied to the nickel-containing crucible or by controlling the amount of nickel introduced into such crucible, etc.), that the amount of nickel therein ranges between about 20 and about 55 atomic percent. Amorphous layers containing Ta and about 20 to 55 atomic percent of Ni therein are stable up to about 300° C. and exhibit a specific electrical resistance ranging between about 130 to about 320 $\mu\Omega \cdot$ cm and exhibit a temperature coefficient for such resistance which varies between about $+500$ and $-300$ ppm/° K. When amorphous Ta-Ni alloy layers are heated to above about 400° C., a slight irreversible reduction in resistance becomes manifest and amounts to approximately one-tenth of the original resistance value since these layers tend to at least partially assume a microcrystalline state at elevated temperatures. Further, when layers containing Ta and an amount of Ni above about 55 atomic percent are produced, the amorphous phase tends to disappear and β-tantalum and nickel may exist next to one another.

An amorphous layer containing Ta and nitrogen may be produced in a somewhat similar fashion to that just described, except that only one crucible, i.e., for Ta, is required and the nitrogen may be introduced into the interior of the housing via a controlled gas inlet means, such as 12. In this instance, an amorphous Ta layer having nitrogen incorporated therein forms as the deposited layer. Amorphous Ta-N layers of this type maintain their amorphous state, i.e., are stable, up to temperatures of about 300° C. In producing this type of layer, a nitrogen partial pressure of about $5 \cdot 10^{-5}$ Pa. is preferably provided within the operational environment, as in the interior of housing 1, and preferably a substrate temperature of about $-160°$ C. is provided. The specific electrical resistance exhibited by such layers is, for example, about 900 $\mu\Omega \cdot$ cm, with a $N_2$-partial pressure of about $6 \cdot 10^{-4}$ Pa. during deposition. The temperature coefficient of the electrical resistance (generally corresponding to the above $N_2$-partial pressures) varies between about $-750$ and $-950$ ppm/° K.

Amorphous layers containing Ta and having a Co content of between about 25 to 30 atomic percent are relatively stable at elevated temperatures, including room temperatures and exhibit a specific electrical resistance which ranges between about 150 to 180 $\mu\Omega \cdot$ cm and the temperature coefficient of such resistance varies between about $0 \pm 15/°$ K. over a temperature range of about $-140°$ C. to $+350°$ C.

The foregoing is considered as illustrative only of the principles of the invention. Further, since numerous modifications and changes will readily occur to those skilled in the art, it is not desired to limit the invention to the exact compositions, methods, constructions and operations shown and described and accordingly, all suitable modifications and equivalents may be resorted to, falling within the scope of the invention as claimed.

I claim as my invention:

1. An amorphous alloy layer consisting of Ta and between about 20 to 80 atomic percent Co.

2. An amorphous alloy layer comprised of Ta and N, said layer being produced by generating Ta vapors in an operable vacuum environment having $N_2$ therein at a partial pressure of at least $6 \cdot 10^{-4}$ Pa. and depositing said Ta vapor onto a substrate cooled to at least below about $-90°$ C.